United States Patent
Manstretta et al.

(10) Patent No.: US 6,288,594 B1
(45) Date of Patent: Sep. 11, 2001

(54) MONOLITHICALLY INTEGRATED SELECTOR FOR ELECTRICALLY PROGRAMMABLE MEMORY CELL DEVICES

(75) Inventors: Alessandro Manstretta, Broni; Andrea Pierin, Graffignana; Guido Torelli, Sant'Alessio Con Vialone, all of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/674,395
(22) PCT Filed: Jun. 30, 1999
(86) PCT No.: PCT/IB99/01225
  § 371 Date: Oct. 30, 2000
  § 102(e) Date: Oct. 30, 2000
(87) PCT Pub. No.: WO00/00984
  PCT Pub. Date: Jan. 6, 2000

(30) Foreign Application Priority Data

Jun. 30, 1998 (EP) .................................................. 98830391

(51) Int. Cl.[7] .................................................. H03K 17/62
(52) U.S. Cl. ............................................. 327/408; 327/544
(58) Field of Search .................................. 327/403, 407, 327/408, 544, 545, 546, 69, 70; 365/226, 227; 307/66

(56) References Cited

U.S. PATENT DOCUMENTS

| 5,021,680 | * | 6/1991 | Zaw Win et al. | 327/408 |
| 5,187,396 | * | 2/1993 | Armstrong, II et al. | 327/407 |
| 5,517,153 | * | 5/1996 | Yin et al. | 327/408 |
| 5,534,801 | * | 7/1996 | Wu et al. | 327/545 |
| 5,570,061 | * | 10/1996 | Shimoda | 327/545 |

\* cited by examiner

Primary Examiner—Toan Tran
(74) Attorney, Agent, or Firm—Theodore E. Galanthay; Jon A. Gibbons; Fleit, Kain, Gibbons, Gutman & Bongini P.L.

(57) ABSTRACT

A monolithically integrated selector for electrically programmable memory cell devices can be switched at an output terminal (OUT) between a high voltage (HV) and a low voltage (LV). It comprises a leg (N2, N1) of fast ground discharge (GND) from the output terminal, a discharge control leg (P1, N3, N4) driving the selector switching through a phase generator (PHG).

5 Claims, 4 Drawing Sheets

MONOLITHICALLY INTEGRATED SELECTOR FOR ELECTRICALLY PROGRAMMABLE MEMORY CELL DEVICES

TECHNICAL FIELD

This invention relates generally to high-voltage and low-voltage selection circuits for non-volatile memories, and in particular, is directed to a selector integrated monolithically to a CMOS technology high switching-speed circuit for memories.

BACKGROUND ART

Integrated circuits more and more frequently involve the provision of different voltages for distribution to the circuit interior according to an activated operative phase. For instance, different voltages are required in semiconductor non-volatile memory (FLASH, EPROM, E$^2$PROM) devices for the purpose of biasing wordlines during the different functional phases of the device. For a NOR memory architecture, for example, read operations involve biasing the wordline of an addressed cell to the same voltage as the supply voltage ($V_{dd}$=3 or 5 Volts), whereas suitably higher voltages (e.g., Vpp=12 Volts) must be applied during the programming phase. Vdd is the supply voltage from an external source of the device, and Vpp may either be an externally supplied voltage, or a voltage generated internally from Vdd. With multi-level memory devices, moreover, a wordline bias voltage during a reading phase would exceed the value of the supply voltage Vdd (normally of 3 or 5 Volts). In order to allocate a larger number of levels than two in a reliable manner, the range of viable cell currents must be expanded to at least 100–120 $\mu$A; such current values are only possible, however, where gate voltages in the 5 to 6 Volts range are adopted. In addition, during specific functional phases (such as those activated for testing purposes), the wordline of a selected cell must be brought to an analog voltage in the 0 to VPP range for reading in the DMA (Direct Memory Access) mode, as the skilled ones in the art will recognize.

Integrated circuits thus operated are of necessity to incorporate a selector, which will be controlled by appropriate control signals to take up and distribute a desired voltage each time to the involved blocks.

Specifically in the instance of a non-volatile memory, there are basically two voltage lines (hereinafter referenced LV and HV) to be taken into account for the biasing of the wordlines, and the selector is mainly utilized to bias the wordlines. In this case, the selector will switch the power supply to the decoding final stages, as shown in FIG. 1 of the drawings, between the low LV and high HV voltages according to whether an addressed cell is to be read or programmed.

Examples of prior selectors are disclosed in European Patent Application No. 98830332.7 by this Applicant.

The most commonly utilized programming technique (referred to as the program-verify algorithm) consists of applying, to the control gate of a selected cell, a high-voltage HV pulse (corresponding to the injection of hot electrons into the floating gate, and therefore, to the cell programming phase), followed by a low-voltage LV pulse during which the programmed state of the cell is "verified" by a read (verify) operation. If the programmed state of the cell matches the desired state, the procedure is stopped; otherwise, the program process is -continued with the application of a new high-voltage HV pulse.

In a multi-megabit memory, the selector output node OUT has a high capacitive load (for example, a load of about 800 pF for 4096 wordlines). In such context, of special concern are the HV/LV and LV/HV switching times and the settling times of the voltages on the selected line, especially with internal programming, that is a programming implemented through circuit blocks integrated to the device inside. In fact, one of the advantages of internal rather than external programming (i.e., as implemented by a special programming apparatus) is its speed, understood as the durations of the program and verify pulses being short, and short being, accordingly, the overall programming procedure In particular, as an illustration of magnitude, a typical duration can range from a hundred $\mu$s per pulse, for external programming, to one $\mu$s per pulse for internal programming. It can be readily appreciated that, when operating in such a range, the switching and settling times become critical parameters.

This problem acquires special importance where the generator(s) of the voltage to be distributed following a switch in the control signal has(have) a high output impedance. In that case, unless appropriate measures are taken, the switching/settling time can become too long, in view of the high capacitive load present on the node "OUT". This is the case, for example, of a voltage LV generated by an integrated voltage generator (or generators), i.e. of the charge pump type, whose output impedance is indeed high. Thus, the HV/LV switchings have, in this case, the above referred drawbacks.

On the other hand, during complementary LV→HV switchings no such problems are supposed to exist, since the HV voltage is assumedly supplied from a low output impedance generator.

The underlying technical problem of this invention is to provide a monolithically integrated selector for electrically programmable memory cell devices, whereby the operations can be carried out at a faster rate.

DISCLOSURE OF INVENTION

This problem is solved by a monolithically integrable voltage selector as previously indicated and defined in claim 1.

The features and advantages of a voltage selector according to the invention will be apparent from the following description of an embodiment thereof, given by way of non-limitative example with reference to the accompanying drawings.

MODES FOR CARRYING OUT THE INVENTION

Figure 1:
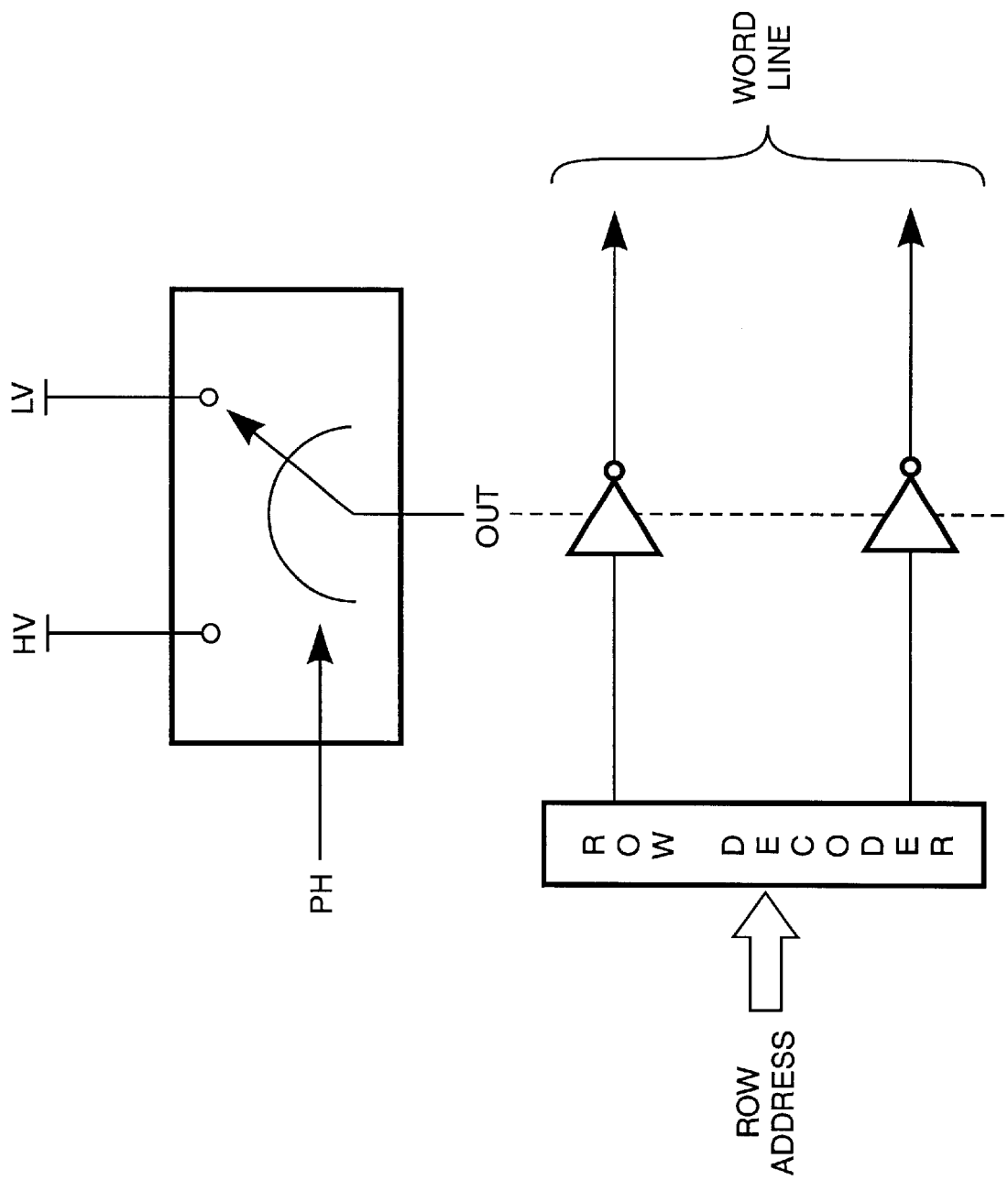
FIG. 1 shows a circuit architecture for memory devices, including a voltage selector for final decoding stages.
Figure 2:
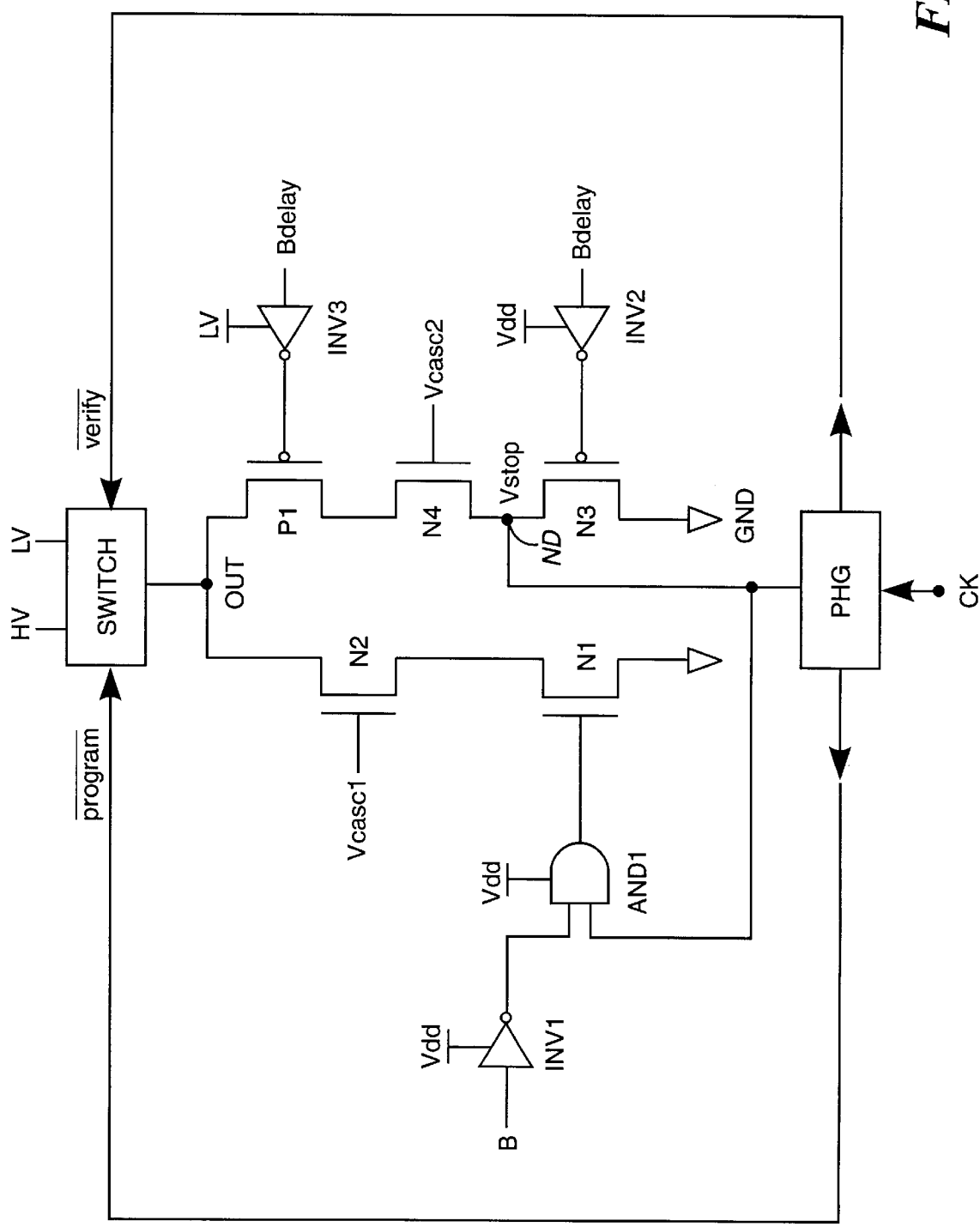
FIG. 2 is a circuit diagram, partly in block form, of a voltage selector according to the invention

As shown in FIG. 2, a selector, integrated monolithically to a CMOS technology circuit and intended for electrically programmable memory cell devices, according to the invention has first and second terminals for coupling to first HV and second LV voltage generators the voltages generated thereby being higher and lower ones, respectively; an output terminal OUT; a first control terminal $\overline{\text{program}}$ and second control terminal $\overline{\text{verify}}$ for the output OUT connection respectively to the first and second voltage generators.

It comprises, according to the invention circuit means N1, N2 adapted to provide a low-impedance discharge path between the output terminal of the selector and the circuit ground GND, and circuit means P1, N3, N4 of detecting the voltage at the selector output terminal. These are coupled to the second voltage generator (LV) and adapted to de-activate the circuit means of the discharge path upon the voltage at the output terminal OUT falling to a predetermined value close to that of the voltage LV generated by the second voltage generators and to send a control signal to the second control terminal through a phase generator (PHG) which is coupled to the first and second control terminals.

The first circuit means of the discharge path comprise first N1 and second N2 n-channel transistors connected together in series, between the ground GND and the selector output terminal OUT.

The voltage detecting circuit means comprise third N3 and fourth N4 n-channel transistors, and a fifth, p-channel transistor P1, connected together in series, between the ground GND and the selector output terminal OUT.

The gate terminals of the second and fourth transistors are connected to voltage references, $V_{CASC1}$ and $V_{CASC2}$ (that can be, in some case, the same) and the gate terminals of the first, third and fifth transistors are applied signals B, Bdelay derived from the phase generator through first, second and third inverting elements INV1, INV2, INV3, respectively.

The gate terminal of the first transistor N1 is connected to the first inverting element INV1 and the circuit node ND interconnecting the third N3 and fourth N4 transistors through a first logic gate AND1 of the AND type.

The third inverting element INV3 is connected to the second voltage LV generator powering it, and this element is the characterizing one of this invention.

Figure 4:
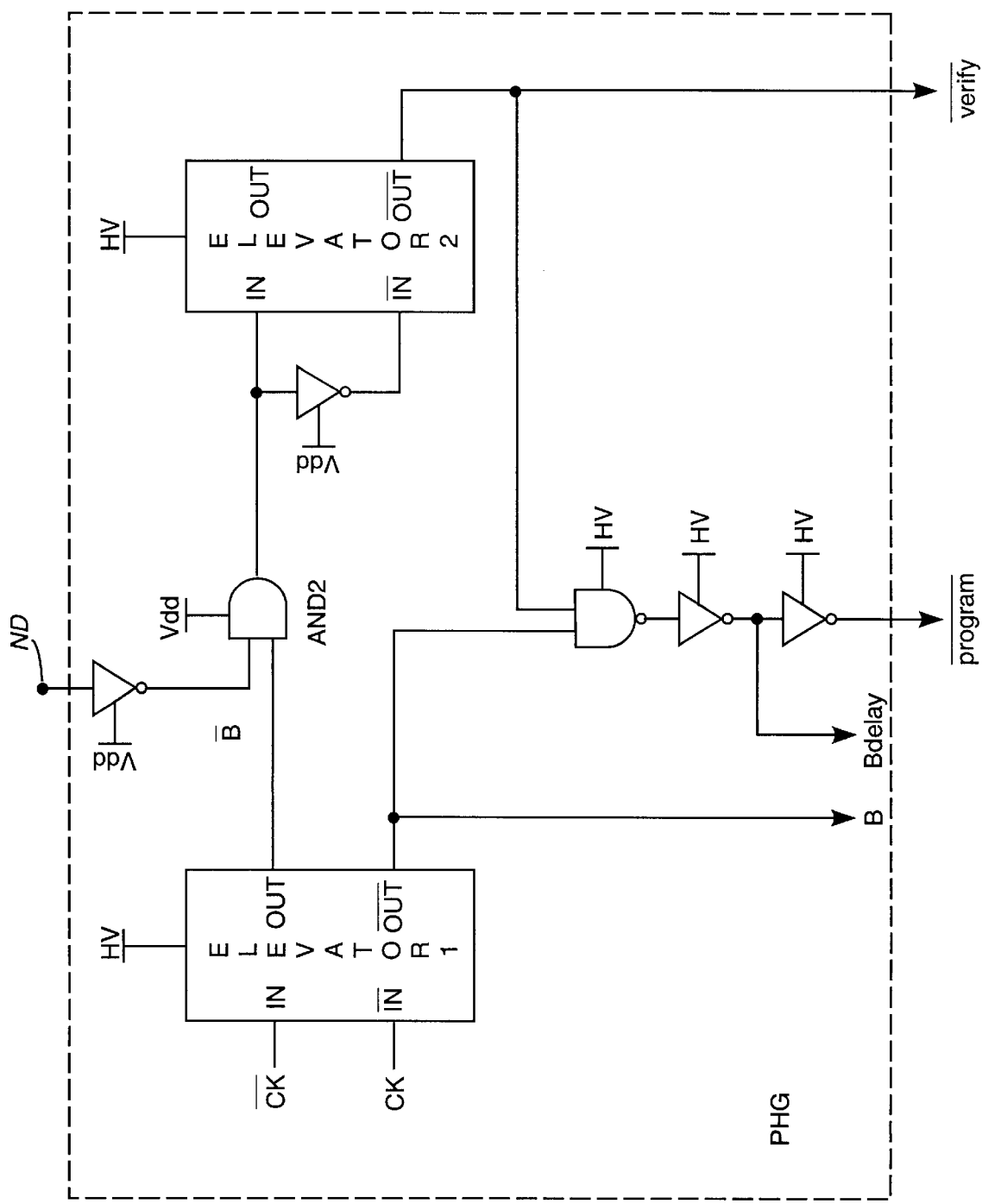
FIG. 4 is a circuit diagram of a portion of a voltage selector according to the invention adapted for implementation, for example, in memory devices of the multi-level type.

The phase generator PHG comprises, as shown in FIG. 4, a second logic gate AND2 of the AND type, whereby it is connected to the circuit node ND and an input terminal for clock signals CK.

The signals B derived from the phase generator and applied to the first transistor N1 are obtained by the clock signals, and the signals Bdelay applied to the third N3 and fifth Pi transistors have a predetermined delay to the clock signals.

The second logic gate AND2 has an output terminal coupled to the second connection control terminal $\overline{\text{verify}}$. A logic gate of the NAND type (NAND) has its input terminals coupled to the input terminal of clock signals (CK) and the output terminal of the second logic gate AND2, and has an output terminal $\overline{\text{program}}$ coupled to the first connection control terminal $\overline{\text{program}}$.

The fast discharge leg N1/N2 and the discharge-stopping control leg N3/N4/P1 are both provided, for improved reliability reasons, with protection structures formed conventionally of cascode stages (the transistors N2 and N4 have their gate electrodes biased to suitable fixed voltages $V_{CASC1}$ and $V_{CASC2}$). in fact, without such structures, the drain terminals of the transistors N1 and N3 would be biased to the voltage HV throughout the operational phases where it is distributed by the selector. In view of the values taken by the voltage HV (which values may be as high as 12 Volts or more in the application considered), the electrical stress induced o n these transistors can damage them. By contrast the use of suitably dimensioned and biased cascode stages allow s the voltage HV to be properly split up between the n-channel transistors, thereby bringing th e values of their Vds back within an acceptable range for reliability.

Figure 3:
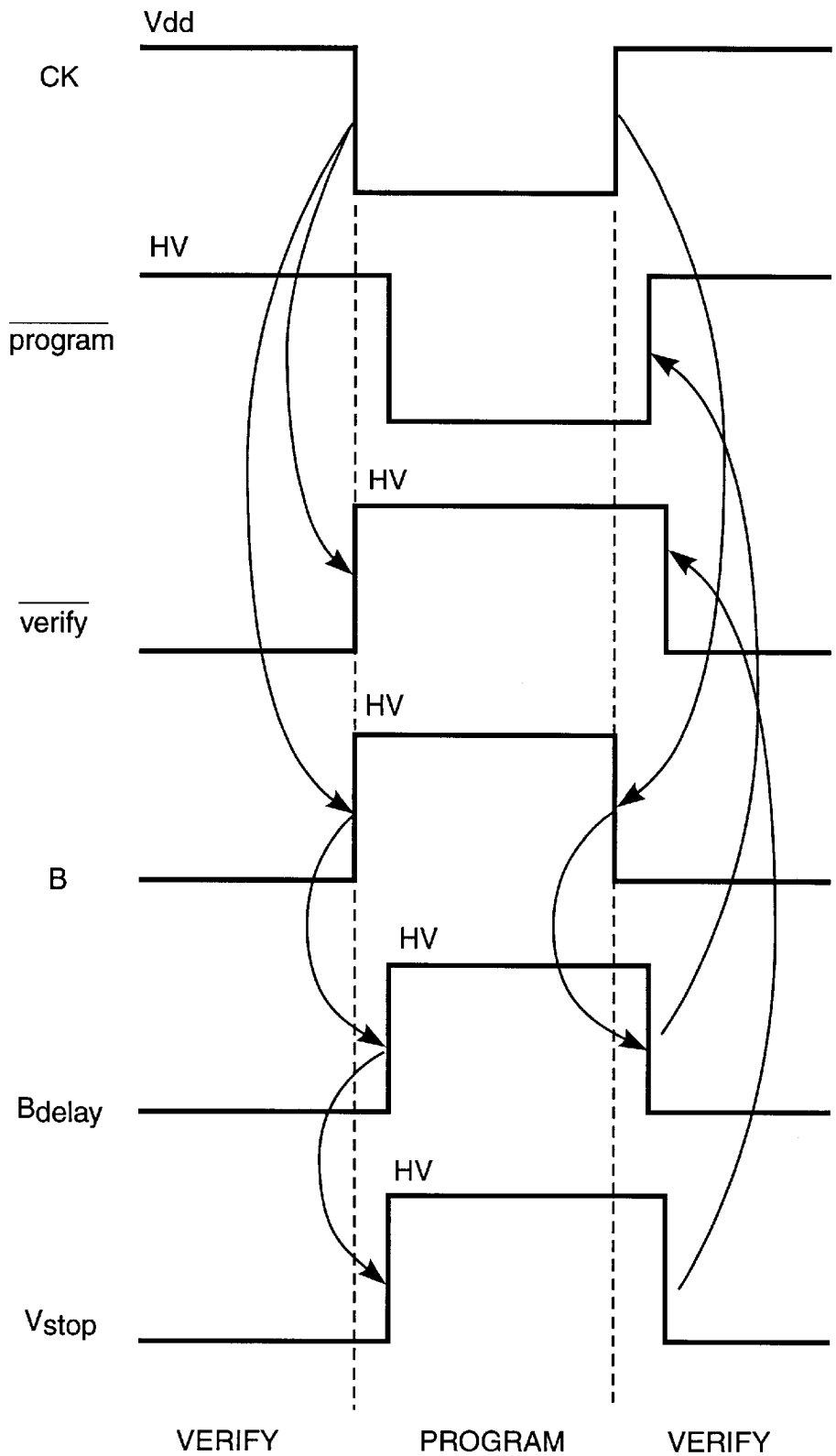
FIG. 3 is a timing diagram of the circuit signals.

To appreciate the system operation, a typical verify-program-verify cycle will now be discussed, again in connection with the voltage s that will be applied to the gate electrode of the selected cells. It should also be noted that p-channel pass transistors are generally used as "switch" block selection elements in the implementation of the selector circuit. Consequently, the programming and verifying control phases will respectively determine the selection of HV and LV when taking a low logic value (rather than a high value as one might think). Accordingly, the aforementioned signals will be active at a low level, and are designated $\overline{\text{program}}$ and $\overline{\text{verify}}$. FIG. 3 is a timing diagram for the signals used in operation of the proposed circuit.

During the verify period, the external clock CK is held fixedly at 1. Consequently, the control phases B and $\overline{\text{B}}$ (FIG. 2) will be at 0 and HV, respectively. These values cause the transistor P1 to be turned off, the transistor N3 turned on, and hence a low logic value placed on the node ND. This value, once carried over in negated form to the gate AND2, will cause, in combination with the signal $\overline{\text{B}}$, the ELEVATOR2 input to go high, and result, therefore, in the $\overline{\text{verify}}$ signal being null. The control signal $\overline{\text{program}}$ is forced to 1, by means of the NAND gate and the two inverters in cascade.

At the end of the verify period, the external clock CK exits the logic high state and goes to zero. Responsive to this change, the phases 3 and $\overline{\text{B}}$ go to HV and 0, respectively, and due to the null value of B, the signal $\overline{\text{verify}}$ will change from 0 to HV, thereby terminating the verify period or period of selection of the voltage LV.

On the other hand, the control signal $\overline{\text{program}}$ will retain its state equal to HV until both B and $\overline{\text{verify}}$ go to the high logic level, and only then will it switch from Hv over to zero, this occurrence causing the HV voltage to be selected at the selector. The node OUT is then quickly charged to the value of HV from its respective generator. Simultaneously therewith, the high logic value of the control phase Bdelay drives the gates of N3 and P1 to zero through the inverters INV1 and INV2. As a result, N3 is turned of f and P1 turned on, causing the node ND to be charged to the value of Vout (i.e., of HV).

The use of the control phase Bdelay instead of the standard phase B is justified by the need to avoid spurious configurations of the 1-1 type at one input of the gate AND1 which is driving the transistor N1 (and, accordingly, controlling the fast discharge process). In fact, before the node ND is charged to the voltage HV because of the transistor P1 being turned on, the other input of the gate AND1 is driven to zero by the phase 3 through the inverter INV1.

The use of an inverter to drive the transistor P1 might appear unjustified at first sight. It could indeed be objected that the fixed biasing of the gate of P1 to the LV voltage is sufficient insurance of it being on during the program periods. But this is only true for a two-level memory device wherein HV=12V and LV=Vdd=3V or SV. In a multi-level environment, the HV voltage may vary instead (for example, where a variable gate voltage type of programming technique is used) from a minimum value of GV to a maximum of 12V. Thus, it can be appreciated that at minimum values of HV, the turning on of the transistor P1 cannot be ensured, and that the operation of the overall discharge system would be impaired.

As for the state of the transistor N1, it should be noted that the configuration of the signals B and Vstop (specifically, their timing) also ensures that it would be turned off. In fact, if during the verify period a low logic value at the output of the gate AND1 has been determined by the voltage Vstop at the node ND, that value will be determined by the control signal B during the program period.

At the end of the program pulse duration (e.g., 1 $\mu$s) the external clock CK will terminate the program period by going back to 1. Responsive to this, the signal B will go back to zero, and thus the signal $\overline{\text{program}}$ will go to 1. Then, the control signal $\overline{\text{verify}}$ will no longer change directly on command from the external clock, because the high logic value placed on the node ND is inhibiting the other input of the logic gate AND2 and, hence, any changes at the output thereof.

The low logic value taken by the control signal B activates the transistors N1, N3 and generates, on the gate of P1, a voltage equal to LV (notice in this respect that the inverter INV3 is supplied the voltage LV). As a result, the node OUT begins to discharge quickly through the leg N1–N2 down to a value of LV+|$V_{thP1}$|(=discharge stop threshold). On this occurrence, P1 is turned off and the node ND relatively quickly discharged to zero through N3. Responsive to this, the gate AND1 will brine its output to zero, and the transistor Ni be deactivated in consequence (thereby terminating the node OUT quick discharging process).

Thus, in consideration of the discharge time of the node ND (determined by the driving capability of N3, and by the load as seen from the node) and the switching time of the gate AND1, the value at which the discharging process is stopped will be smaller than LV+|$V_{thP1}$|. An appropriate dimensioning of the transistors N1 and N3 will enable this value to be adjusted to lie as close as possible to that of the voltage LV. It follows that, when the selector causes the next verify phase to start, the generator of LV can be expected to apply a very small amount of adjustment, involving shorter settling times (~100 ns in the case under consideration), even where the output impedance of the LV generator itself is high.

The proposed system has a specific application in particular in the field of non-volatile memory programming. Considerations of reliability (immunity to disturbance while reading and programming as well as holding) and technology (sensitivity of the program and read circuits), dictate the use of a voltage LV of about S.SV. Where a memory device has a single 3V supply (referred to as a 3V-only device), this specification cannot be met by the single expedient of generating the voltage LV inside the device, typically by means of charge pumps generating LV from the supply voltage Vdd=3V.

In this context, performance in terms of settling time of the selector output voltage Vout during HV/LV changes is tied to the output characteristic of the generator of LV. Unfortunately, design requirements of this generator related to the power consumption and, above all, accuracy of voltage generation, clash with the demand far a fast response rate, because the design usually involves a high output impedance. Thus, if the generator of LV were to fully manage the HV/LV transition of Vout, performance in terms of settling times would be unsatisfactory. In a typical design, the worst-case (i.e., HV=12V) settling time of Vout may be in the 1 $\mu$s range.

The circuit implementation of this invention improves performance aver the state of the art, according to the requirements of a multi-level application far which the circuit has been designed.

The system solves the problem of a long settling time by taking aver in the task of the "coarse" initial discharge of the node Vout (which may be on the order' of several volts), to then effect a "fine" final adjustment (which may be on the order of a few hundreds millivolts) by means of the voltage LV generators This operation allows the settling time of Vout to be reduced by one order of magnitude (~100 $\mu$s as against approximately 1 $\mu$s which should be provided without the high-speed controlled discharge system).

In this way, the duration of the verify period can be further reduced.

It can be really reduced from that of the programming pulse, which may be of 1 $\mu$s; the verify period could be reduced, while retaining a safe margin in the respect of all process and operation variations, to less than 500 ns, which is also good for the overall duration of the programming process.

Changes and modifications may be made unto the invention within the scope of the claims which follow.

What is claimed is:

1. A selector integrated monolithically to a CMOS technology circuit for electrically programmable memory cell devices having first and second input terminals for coupling to first (HV) and second (LV) voltage generators, respectively, the voltages from said generators being respectively a higher and a lower one, an output terminal (OUT), and first (program) and second (verify) control terminals for connection said output terminal (OUT) to the first and the second voltage generators respectively, characterized in that it comprises first circuit means (N1,N2) adapted to form a low-impedance discharge path between the output terminal (OUT) of the selector and a circuit ground, and circuit means of detecting the voltage at the output terminal of the selector (P1,N3,N4) which are coupled to the second voltage generator (LV) and adapted to deactivate said first circuit means upon the voltage at the output terminal falling to a predetermined value close to that of the voltage from the second voltage generator and adapted to send a control signal to the second control terminal through a phase generator (PHG) coupled to the first and second control terminals.

2. A selector according to claim 1, characterized in that the first circuit means comprise first (N1) and second (N2) n-channel transistors connected together in series between ground (GND) and the selector output terminal (OUT), and the voltage-detecting circuit means comprise third (N3) and fourth (N4) n-channel transistors as well as a fifth p-channel transistor (P1), connected together in series between ground (GND) and the selector output terminal (OUT), the control terminals of the second and fourth transistors being connected to voltage references (Vcasc) and the control terminals of the first, third and fifth transistors being applied signals which are derived from the phase generator (B,Bdelay) through respective first, second and third inverting elements (INV1,INV2,INV3), and that the control terminal of the first transistor (N1) is connected to the first inverting element (INV1) and a circuit node (ND) interconnecting the third (N3) and fourth (N4) transistors through a first logic gate of the AND type (AND1), the third inverting element (INV3) being connected to the second voltage generator (LV) providing its power supply.

3. A selector according to claim 2, characterized in that the phase generator (PHG) includes a second logic gate of the AND type (AND2) whereby it is coupled to said circuit node (ND) and a clock signal input terminal (CK).

4. A selector according to claim 3, characterized in that the signals (B) derived from the phase generator and applied to the first transistor (N1) are coincident with the clock signals, and those applied (Bdelay) to the third (N3) and fifth (P1) transistors have a predetermined delay to the clock signals.

5. A selector according to claim 4, characterized in that the second logic gate (AND2) has an output terminal coupled to the second connection control terminal ($\overline{\text{verify}}$), and that it includes a logic gate of the NAND-type (NAND) having its input terminals coupled to the clock signal input terminal (CK) and the output terminal of the second logic gate (AND2) and having an output terminal coupled to the first connection control terminal ($\overline{\text{program}}$).

* * * * *